US008578854B2

(12) United States Patent
Sievers

(10) Patent No.: US 8,578,854 B2
(45) Date of Patent: *Nov. 12, 2013

(54) CURING OF PHOTO-CURABLE PRINTING PLATES USING A LIGHT TUNNEL OF MIRRORED WALLS AND HAVING A POLYGONAL CROSS-SECTION LIKE A KALEIDOSCOPE

(75) Inventor: Wolfgang Sievers, Kremperheide (DE)

(73) Assignee: Esko-Graphics Imaging GmbH, Itzehoe (DE)

( * ) Notice: Subject to any disclaimer, the term of this patent is extended or adjusted under 35 U.S.C. 154(b) by 472 days.

This patent is subject to a terminal disclaimer.

(21) Appl. No.: 12/467,055

(22) Filed: May 15, 2009

(65) Prior Publication Data

US 2009/0290891 A1 Nov. 26, 2009

Related U.S. Application Data

(60) Provisional application No. 61/055,910, filed on May 23, 2008, provisional application No. 61/056,272, filed on May 27, 2008.

(51) Int. Cl.
G03F 7/207 (2006.01)
(52) U.S. Cl.
USPC .......................................... 101/467; 101/494
(58) Field of Classification Search
None
See application file for complete search history.

(56) References Cited

U.S. PATENT DOCUMENTS

| 5,386,268 | A | 1/1995 | Ohlig ............................. 355/70 |
| 6,683,421 | B1 | 1/2004 | Kennedy et al. ............. 315/291 |
| 8,227,769 | B2 * | 7/2012 | Sievers ...................... 250/492.1 |
| 2005/0183597 | A1 | 8/2005 | Hull et al. ................. 101/401.1 |
| 2005/0247947 | A1 | 11/2005 | Owen et al. ...................... 257/89 |
| 2007/0287091 | A1 | 12/2007 | Jacobo et al. ................. 430/154 |
| 2008/0157009 | A1 * | 7/2008 | Wittenberg et al. ....... 250/494.1 |
| 2011/0104615 | A1 * | 5/2011 | Sievers ........................ 430/300 |

FOREIGN PATENT DOCUMENTS

| DE | 2606861 | 8/1977 |
| DE | 2606861 A * | 8/1977 |
| DE | 202004017044 U1 * | 2/2005 |
| DE | 202007008768 | 10/2007 |

OTHER PUBLICATIONS

Extended European Search Report for EPO Application No. EP09161039.4 dated Sep. 28, 2009.

* cited by examiner

Primary Examiner — Joshua D Zimmerman
(74) Attorney, Agent, or Firm — Dov Rosenfeld; INVENTEK

(57) ABSTRACT

An apparatus, a method, and a plate made by the method, e.g., using the apparatus. The apparatus includes a light tunnel of light reflective walls with polygonal cross-section like a kaleidoscope, and a light source, located at one end to produce light radiation to the inside of the light tunnel towards the other end. Light entering the light tunnel towards an inner reflective surface of a wall is reflected off the inner reflective surface so that it can emerge from the other end to cure a plate having photo-curable material thereon.

30 Claims, 16 Drawing Sheets

CURING OF PHOTO-CURABLE PRINTING PLATES USING A LIGHT TUNNEL OF MIRRORED WALLS AND HAVING A POLYGONAL CROSS-SECTION LIKE A KALEIDOSCOPE

RELATED APPLICATION(S)

The present invention claims benefit of and is a conversion of U.S. Provisional Patent Applications Nos. 61/055,910 filed 23 May 2008 and 61/056,272 filed 27 May 2008. The contents of each of such U.S. 61/055,910 and U.S. 61/056,272 are incorporated herein by reference.

FIELD OF THE INVENTION

The present disclosure relates generally to preparing printing plates for printing.

BACKGROUND

This disclosure describes a method and an apparatus for improving light exposure, e.g., ultraviolet exposure of photo-curable printing plates, e.g., photopolymer flexographic printing plates, letterpress plates and other polymer printing plates, as well as polymer sleeves and polymer coated printing cylinders. Photo-curable, of course, means curable by photons, e.g., light, e.g., light in the ultraviolet range or some other range.

The term photopolymer plate, or in its shortened form, polymer plate is used herein to refer to any printing plate, cylinder or sleeve that is cured by application of light, such as ultraviolet (UV) radiation, i.e., that is made of or has thereon a photo-curable material such as a photopolymer. The terms "photopolymer" and "polymer" are included because in current practice, the UV curable material is typically made of a polymer. The invention, however, is not limited to use of a polymer material, and the terms "a photopolymer plate," and "a polymer plate" mean any plate, cylinder or sleeve made of or with any UV curable material thereon, whether polymer or not.

Photopolymer plates have found a broad range of applications. A variety of different methods can be applied for transferring an image for printing, e.g., in the form of imaging data, to a polymer plate. For example, an image mask, which can be a film applied to the surface of the plate while the plate is exposed, or a layer directly on top of the polymer surface is laser ablated layer directly on top of the polymer surface, is placed on top of a polymer sheet.

By a digital plate is meant a plate that is exposed to imaging data by ablating a mask material that is on the plate, e.g., by exposure to laser radiation in an imaging device. The process of producing a digital plate is called a digital process herein.

By a conventional analog plate is meant a plate that is exposed to imaging data by exposing photographic film according to the imaging data, and then using the film to form a mask during exposure to curing radiation. The process of producing a conventional analog plate is called an analog process herein.

Irrespective of the way imaging data is transferred to the plate, the plate needs light, e.g., UV light for curing. Such UV curing is currently done by one of several different methods. After curing, the non-cured portions of the polymer are removed, either using solvents, or by melting the non cured material through heat treatment and absorption with a web.

One UV curing method includes using a bank of UV emitting fluorescence tubes which are placed close to the image mask on top of the polymer plate surface. Although this method produces high quality results, the method requires bulky equipment and a relatively large number of light bulbs leading to high operation costs. Furthermore, due to the bulbs aging differently, homogeneity of the radiation can not be assured, making regular expensive maintenance necessary.

Another UV curing method includes using only a relatively small number of UV light sources—even a single UV source. Having a small number or a single source enables control of the UV light output.

Consider as one example a flat polymer plate, and a high power UV arc lamp with a reflecting mirror above the flat polymer plate. The mirror is designed to direct UV light towards the polymer plate. One undesired property of such and similar arrangements is the relative difficulty to providing homogenous illumination of the polymer of the plate. A typical UV light source such as an arc lamp appears as a point source rather than an extended area source. Hence, relatively complicated and expensive reflector geometries are needed to achieve sufficiently homogenous illumination of the polymer.

One known method of overcoming the problem of achieving homogeneity, is to provide relative motions between the UV light source and the to-be-cured surface. One example of this uses a rotating external drum on the surface of which the plate is placed. With such an arrangement, although each point on the polymer plate receives the same portion of UV light, there are known problems maintaining symmetry of what are called "image shoulders."

Polymer printing plates are three dimensional, that is, include a depth dimension from the printing surface. Small printing details on the plate's surface carry ink for printing. Consider, for example a halftone dot. In order for the dot not to bend and to be able to withstand the pressure during printing, the halftone dot's surface has to be supported by broader shoulders. With rotational UV exposure, it is difficult to achieve symmetry in such shoulders in the circumference versus axial direction, where the axial direction is the direction of the axis of rotation of the drum.

Thus, today's UV light sources typically require relatively expensive measures for distributing the UV light with a sufficient divergence in order to obtain good support shoulders for the printing surface.

DESCRIPTION OF EXAMPLE EMBODIMENTS

Overview

Figures 1, 2:
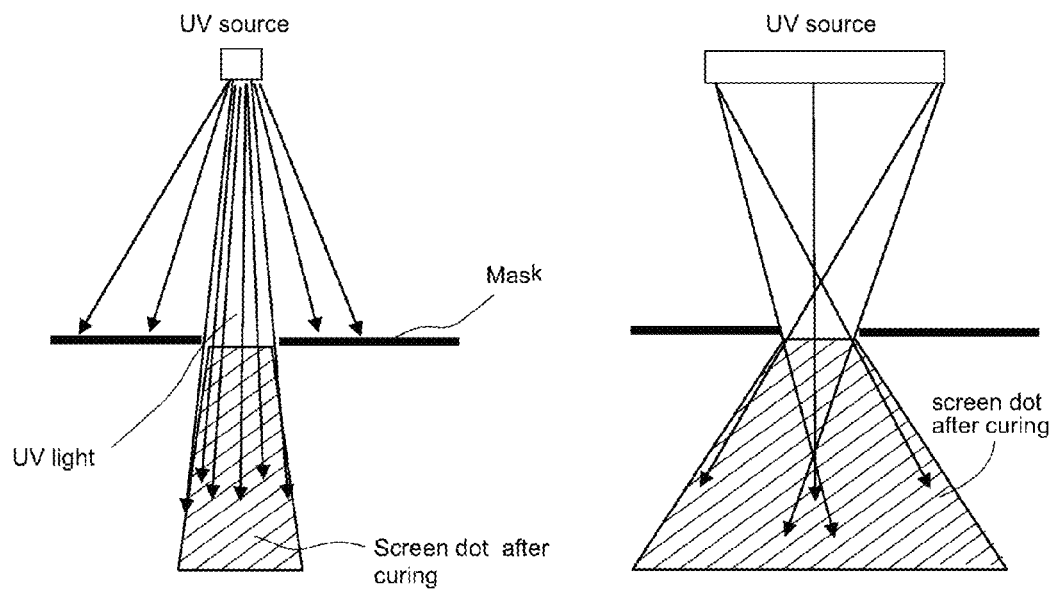
FIG. 1 shows a simplified representation of a cross sectional view of a halftone dot as illuminated by a relatively small source, or by an elongated source, with the cross section being perpendicular to the elongated dimension of an elongated UV source.
FIG. 2 shows a simplified representation of a cross sectional view of a halftone dot as illuminated by a wide source, or an elongated source, with the cross section being parallel to the elongated dimension of the elongated UV source.

Described herein is a method and apparatus that achieves reasonably even distribution of UV light in the interior of UV curable material of a printing plate that is made of or that has the UV curable material thereon, providing relatively broad support shoulders for the printing surface, e.g., compared to what is achievable with today's equipment and methods.

We have found that the method and apparatus described herein also can decrease wasted illumination, possibly leading to high relative efficiency e.g., compared to what is achievable with today's equipment and methods.

Embodiment of the illumination apparatus can readily be build from common UV sources and inexpensive flat mirrors.

One embodiment includes a method comprising placing photo-curable plate near a light exposure unit having a length, a cross-section, and a pair of ends being a source end and a plate end, the plate having a printing surface placed with the printing surface closer to the plate end than the source end with the plate substantially parallel to the cross-section of the light exposure unit.

The light exposure unit includes a light tunnel of light reflective, e.g., mirrored walls and having a polygonal cross-section like a kaleidoscope, wherein one example includes at least four walls, each wall having a reflective inner surface, e.g., the wall being mirrored or having a mirror attached on it. The light exposure unit also includes a light source, e.g., UV source located at or near one end, called the source end of the light tunnel and arranges in operation to produce light radiation, e.g., UV radiation to the inside of the light tunnel towards the other end of the light tunnel, called plate end, including towards the reflective inner surfaces of the walls.

The method includes causing the light source to operate to cure the plate material by applying light radiation, e.g., UV radiation for a time sufficient for curing.

One embodiment includes an apparatus comprising a light tunnel of light reflective, e.g., mirrored walls and having a polygonal cross-section like a kaleidoscope, wherein one example includes at least four walls, each wall having a reflective inner surface, e.g., the wall being mirrored or having a mirror attached on it. The apparatus further includes a light source, e.g., UV source located at or near one end, called the source end of the light tunnel and arranges in operation to produce light radiation, e.g., UV radiation to the inside of the light tunnel towards the other end of the light tunnel, called plate end, including towards the reflective inner surfaces of the walls. Light entering the light tunnel towards an inner reflective surface of a wall is reflected off the inner reflective surface so that it can emerge from the plate end. The combination of the light tunnel and the light source forms a light exposure unit arranged such that when a photo-curable plate is placed near the plate end, e.g., substantially parallel to the cross-section of the light tube, and the light source, e.g., UV source is in operation, the plate material is cured by applying the light radiation for a time sufficient for curing.

One embodiment includes a plate made of or having thereon photo-curable material that is cured according to a method comprising placing photo-curable plate near a light exposure unit having a length, a cross-section, and a pair of ends being a source end and a plate end, the plate having a printing surface placed with the printing surface closer to the plate end than the source end with the plate substantially parallel to the cross-section of the light exposure unit.

The light exposure unit includes a light tunnel of light reflective, e.g., mirrored walls and having a polygonal cross-section like a kaleidoscope, wherein one example includes at least four walls, each wall having a reflective inner surface, e.g., the wall being mirrored or having a mirror attached on it. The light exposure unit also includes a light source, e.g., UV source located at or near one end, called the source end of the light tunnel and arranges in operation to produce light radiation, e.g., UV radiation to the inside of the light tunnel towards the other end of the light tunnel, called plate end, including towards the reflective inner surfaces of the walls.

The method includes causing the light source to operate to cure the plate material by applying light radiation, e.g., UV radiation for a time sufficient for curing.

Particular embodiments may provide all, some, or none of these aspects, features, or advantages. Particular embodiments may provide one or more other aspects, features, or advantages, one or more of which may be readily apparent to a person skilled in the art from the figures, descriptions, and claims herein.

Particular Embodiments

This invention suggests an improved reflector geometry which can be applied at most of the existing UV sources such as arc lamps, fluorescent tubes or UV LED Arrays.

One apparatus embodiment of the invention includes a light tunnel of light reflective, e.g., mirrored walls and having a polygonal cross-section like a kaleidoscope. One example includes at least four walls, each wall having a reflective inner surface, e.g., the wall being mirrored or having a mirror attached on it. The light tunnel is positioned over the mask of a plate with the plate end closest to the plate.

The apparatus includes a light source, e.g., UV source located at or near one end, called the source end of the light tunnel and arranges in operation to produce light radiation, e.g., UV radiation to the inside of the light tunnel towards the other end of the light tunnel, called plate end, including towards the reflective inner surfaces of the walls.

The combination of the light tunnel and the light source forms a light exposure unit arranged such that when a photocurable plate is placed near the plate end, e.g., substantially parallel to the cross-section of the tube, and the light source, e.g., UV source is in operation, the plate material is cured by applying the light radiation for a time sufficient for curing.

In one embodiment, the light tube is of uniform cross-section. However, this is not a requirement. For example, the cross section can change dimension. The main requirement is light entering the light tunnel towards an inner reflective surface of a wall is reflected off the inner reflective surfaces so that it can emerge from the plate end.

In one embodiment, the light tube is made of at least four walls, each wall having a reflective inner surface that is substantially flat.

In one example, the cross-section of the light tube is rectangular.

In one embodiment, the side walls are made up of pairs of walls arranged so that each wall in each pair is substantially parallel to an opposite wall of the pair, with the reflective surfaces facing each other.

Figure 5:
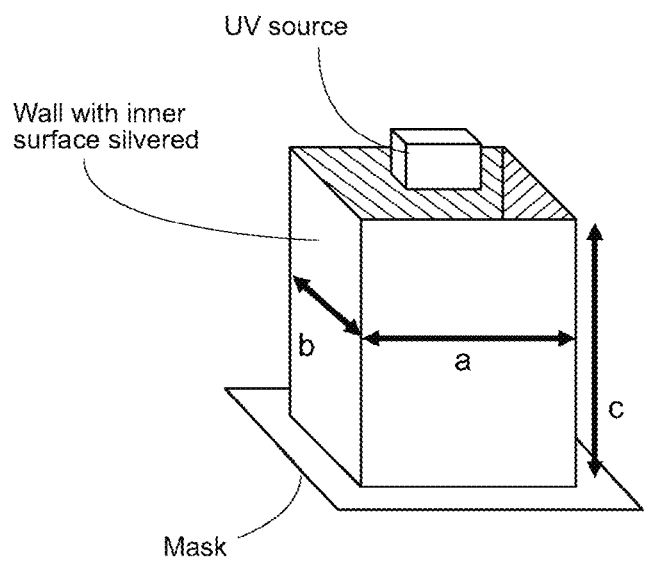
FIG. 5 shows a simplified perspective view of an apparatus embodiment of the invention.

In one example, the cross-section of the light tube is rectangular. FIG. 5 shows a simple perspective view of one embodiment in which the light tube is built of at least four flat reflective surfaces, e.g., mirrored walls. In FIG. 5 there are two pairs of opposite walls to form a tunnel of a rectangular cross-section, and an additional wall behind the light source.

Consider now the curing properties of using the apparatus. First consider illuminating without the light tube. FIG. 1 shows a simplified representation of a cross sectional view of a halftone dot as illuminated by an elongated source, with the cross section being perpendicular to the elongated dimension of an elongated UV source, such as a UV LED array or other elongated UV source. FIG. 1 shows the mask, which can be film or an ablated mask, with a small opening to expose the printing area of the intended half-tone dot to the curing radiation, e.g., UV radiation. FIG. 1 also can be interpreted to show a simplified representation of the cross-section of a halftone dot with a relatively small UV source such as an arc lamp. The cross-section can be, for example, of a halftone dot in a letterpress plate.

In a prior art system that does not include the inventive feature of the present invention of including opposite reflective walls, when the source is relatively large, the support shoulders of the halftone dot can be relatively steep so do not offer a good support for the dot's printing surface. It is desirable to have broader, less steep shoulders.

FIG. 2 shows a simplified representation of a cross sectional view of a halftone dot as illuminated by an elongated source, with the cross section being parallel to the elongated dimension of an elongated UV source, such as a UV LED array or other elongated UV source. FIG. 2 also can be interpreted to show a simplified representation of the cross-section of a halftone dot with a relatively large UV source such as a UV emitting fluorescent tube. Note that it is common in the art to expand the short (narrow) dimensions of fluorescent tubes by using several fluorescent tubes next to each other. The cross-section can be, for examples of a halftone dot in a letterpress plate. In a prior art system that does not include the inventive feature of the present invention of including opposite reflective walls, a relatively broad source can provide a broader, less steep shoulders under the same exposure conditions as those of FIG. 1.

Note that while FIGS. 1 and 2 are each marked prior art, a narrow or even a broad source, when combined with any of the inventive features of the present invention, is not prior art.

Figure 3:
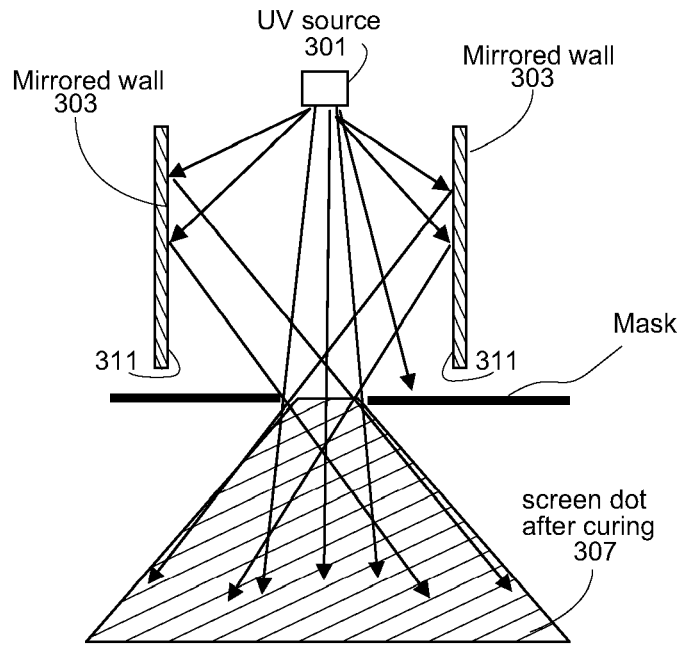
FIG. 3 shows a simplified cross-section of a halftone dot exposed by a relatively small source, including a pair of opposite mirrors of a "kaleidoscope" made of pairs of opposite reflective surfaces in accordance with some embodiments of the present invention.
Figure 4:
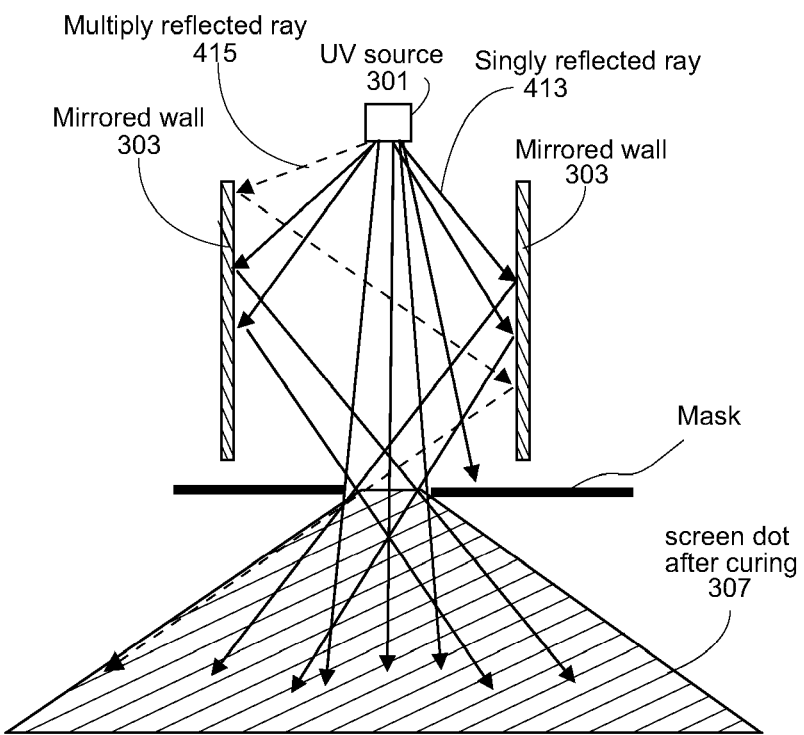
FIG. 4 shows the simplified view of FIG. 3 also showing a ray that undergoes multiple reflections off the side walls.

FIG. 3 shows a simplified cross-section of a halftone dot 307 exposed by a relatively small source 301, including a pair of opposite walls with inner reflective surfaces 311, e.g., mirrored walls 303 of a "kaleidoscope" light tube made of pairs of opposite walls with reflective inner surfaces 311, e.g., mirrors in accordance with an embodiment of the present invention. As can be seen, the support shoulders of a typical halftone dot 307 that result by exposure by such a source are broader than if the same source was used without the kaleidoscope light tunnel. FIG. 4 shows the simplified view of FIG. 3 with the addition of simple line representation of example rays of UV light. Note in FIG. 4 the singly reflected rays, e.g., ray 413 and multiply reflected rays of light, e.g., of UV, such as multiply reflected ray 415.

In FIG. 4, it becomes clear that considering the multiple wall reflections in a kaleidoscope will broaden the shoulders even more. A ray that is so-reflected multiple times is shown by a dotted line (note that the hatched cross-section is the same as FIG. 3).

Depending on the properties of the UV light source a fifth flat mirror will be added behind the lamp to redirect rays traveling into the wrong direction also towards the polymer plate.

In one embodiment, an additional light reflective surface, e.g., an additional mirror is located behind the light source, e.g., UV source, and arranged to reflect light radiation directed behind the light source back towards the plate end, including towards the reflective inner surfaces of the walls. This is particularly useful for a light source, e.g., a UV source that emits radiation in all directions. Examples of UV sources that have this property include, but are not limited to fluorescent tubes or high pressure mercury lamps.

FIG. 5 shows a simple perspective view of one embodiment of a light tube is built of four flat reflective surfaces, e.g., mirrored walls to form a tunnel of a rectangular cross-section. Other embodiments have cross sections that are other than rectangular. In FIG. 5, the dimensions for a rectangular cross-section are shown as the width of the long side, denoted a, the width of the wide side, denoted b, and the light tube length, also called its height, denoted c. These dimensions are configured according to parameters such as the plate size in the case of illuminating a whole plate, the power output of the light source, that is, the power output of the light tube and how much of the power is directed towards the inside of the tube. As described below, the intensity, i.e., power per unit area coming out of the light tube is an important factor for curing.

Note that the light tunnel shown in FIG. 5 has pairs of walls that are parallel to each other. As already stated, it is not however necessary to have walls that are parallel to the length dimension.

Figure 6:
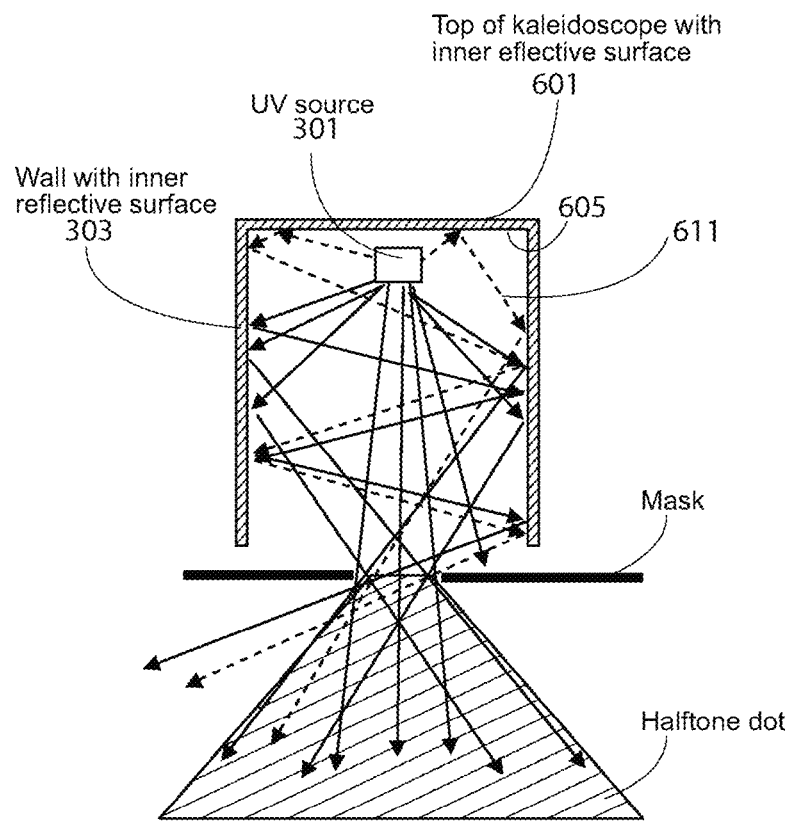
FIG. 6 shows a simplified cross-section of a halftone dot exposed by a relatively small source, including a pair of opposite mirrors of a light tube made of pairs of opposite mirrors and in addition, a reflective surface behind the light source in accordance with embodiments of the invention.

FIG. 6 shows a simplified cross-section of a halftone dot exposed by a relatively small source 301, using a light tube that includes, in addition to the side walls 303 with respective inner reflective surfaces, an additional another element 601 with an inner reflective surface 605, e.g., a flat mirror located behind the light source, e.g., UV source and parallel to the polymer plate. In FIG. 6, rays that are reflected off the flat mirror behind the light source, e.g., rays 611 are shown as broken lines.

In different embodiments, the reflective surface can be made of different materials. In general, the reflectors of embodiment can be built of flat mirrors or of materials with reflective surfaces, so these walls having reflective inner surfaces can be inexpensive and easy to build.

In some embodiments, the reflective surfaces include metal coated glass plates such as conventional glass mirrors.

In other embodiments, the light source is a UV source, and the walls are made of UV reflective material coated aluminum sheets, with the inner surfaces coated with the reflective material.

In some version of such aluminum sheets, the respective reflective surface of at least some of the walls is embossed with UV light diffusing structures.

The inventors have observed that with such structures, more of the radiation emitted from the UV light source is guided towards the mask of the plate compared to the arrangements such as FIG. 1 without the reflective surfaces. Furthermore, the angular distribution of the UV light is more homogenous compared to arrangements such as FIG. 1 and other known arrangements without the reflective surfaces. This leads to the support shoulders of printing structures such as halftone dots wider and thus more robust during print compared to arrangements without the reflective surfaces.

FIG. 6 shows a simplified cross-section of a halftone dot exposed by a relatively small source 301, using a light tube that includes, in addition to the side walls 303 with respective inner reflective surfaces, an additional another element 601 with an inner reflective surface 605, e.g., a flat mirror located behind the light source, e.g., UV source and parallel to the polymer plate. In FIG. 6, rays that are reflected off the flat mirror behind the light source, e.g., rays 611 are shown as broken lines.

In different embodiments, the reflective surface can be made of different materials. In general, the reflectors of embodiment can be built of flat mirrors or of materials with reflective surfaces, so these walls having reflective inner surfaces can be inexpensive and easy to build.

In some embodiments, the reflective surfaces include metal coated glass plates such as conventional glass mirrors.

In other embodiments, the light source is a UV source, and the walls are made of UV reflective material coated aluminum sheets, with the inner surfaces coated with the reflective material.

In some version of such aluminum sheets, the respective reflective surface of at least some of the walls is embossed with UV light diffusing structures.

In some embodiments, the light source is a UV source comprising a fluorescent tube. In other embodiments, the light source is a UV source comprising a mercury lamp.

In some embodiments, the light source is a UV source comprising a UV LED or an array of UV LEDs. Such UV LEDs are available, for example, from Nichia Corporation, Tokyo Japan. Such UV LEDs have several desirable (albeit not necessary) properties, e.g., they exhibit high spectral purity with 100% of their output power at 365 nm. The wavelength has almost no temperature dependence. They produce relatively little heat, they do not overly heat a plate's polymer material. They age slowly, e.g., about 5% power reduction over 1000 h of use, so provide long life with low maintenance requirement. The power output is proportional to the applied electric power.

Nichia Corporation makes for the Assignee of the present invention an array module that has between 100,000 and 200,000 UV LEDs. With 21 A input at 4.4V, such an array module is capable of about 10 W of UV output at a wavelength of 365 nm. The array module includes microchannels for water cooling, and typically uses water that is purified, e.g., free of ions or any particles larger than about 50 μm.

One embodiment of the invention uses a light source made up of such LED array modules. One embodiment of such a UV light source includes 20 such array modules combined to produce a UV light source for a light tube that has a rectangular cross section of about 8 cm by 42 cm. The light source embodiment produces in operation light output of up to 200 W of 365 nm UV radiation. The light source is used, for example, with an external drum exposure system as described further below.

Figure 7:
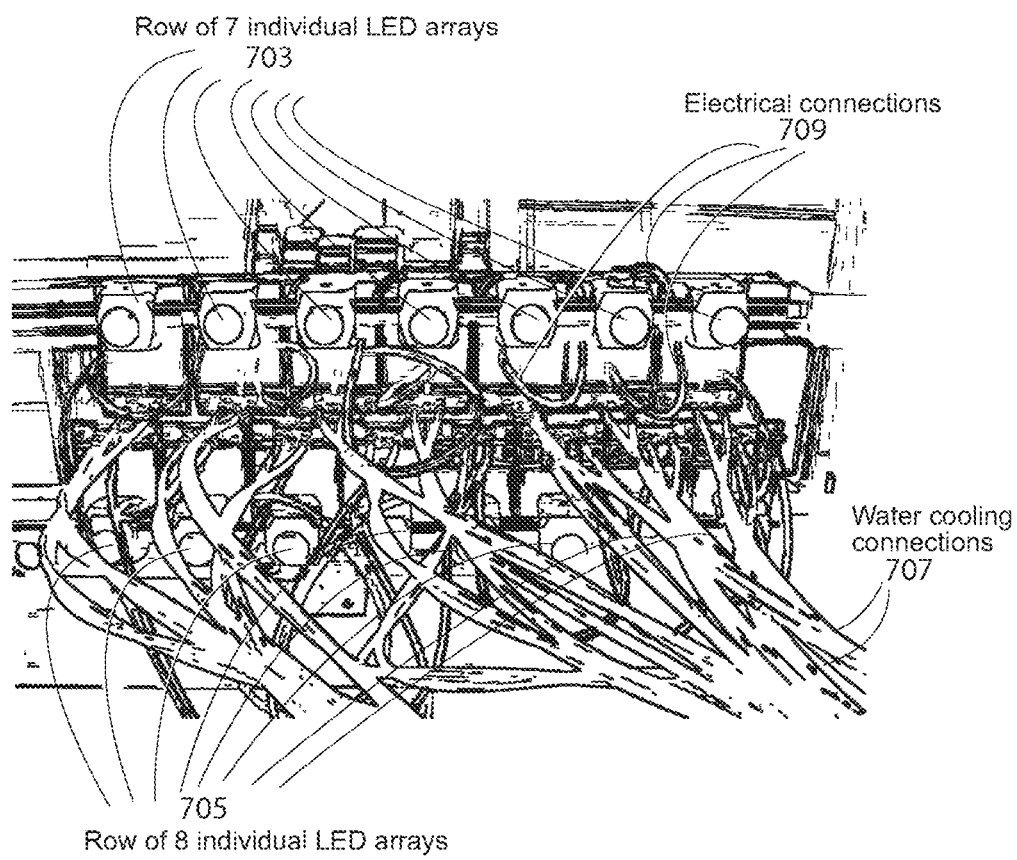
FIG. 7 shows a line drawing made from an actual photograph of an LED array-based light source of the type used in some embodiments of the invention.

One example of such an array, using 15 LED array modules, is now described in more details. FIG. 7 shows a line drawing made from an actual photograph of an LED array light source. The light source includes two rows of LED array modules, a first row 703 of 7 modules shown parallel to a second row 705 of 8 array modules. Each row is offset ½ of the separation of array modules—the array module pitch—relative to the other row. The water cooling connections 707 in the form of pipes and electrical connections 709 in the form of wires for connecting power to the modules can clearly be seen.

Figure 8:
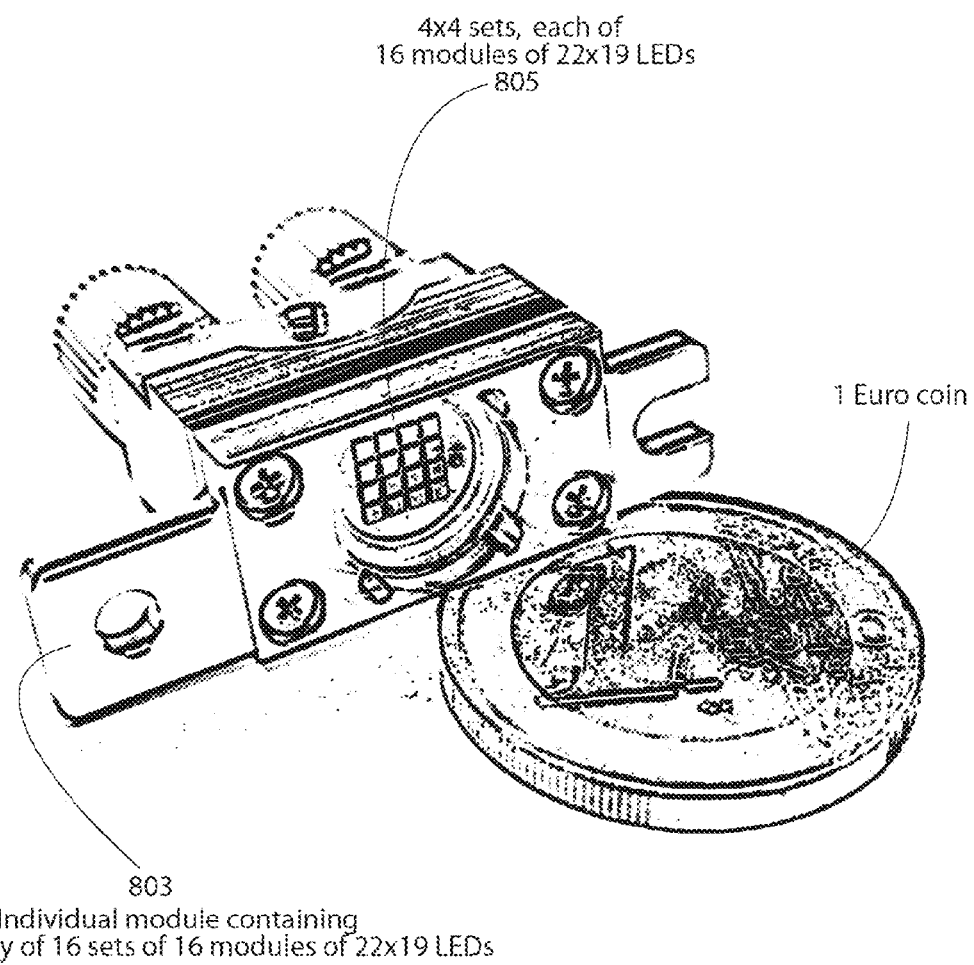
FIG. 8 shows a line drawing made from an actual photograph of an LED array module as used in the light source of FIG. 7.

FIG. 8 shows a line drawing of a perspective view of an individual LED array module 803, and is from an actual photograph. The heat sink and water input/output can clearly be seen. A1 Euro coin (23.25 mm in diameter) is also shown to give a sense of the size. The source itself includes a 4×4 matrix 805 of sets of LEDs. As will be seen in the following photographs, each set includes a 4×4 array of LED units, and each LED unit includes 22×19 LEDs. In such an arrangement, there are therefore 16×16×22×19=107008 UV LEDs.

Figure 9:
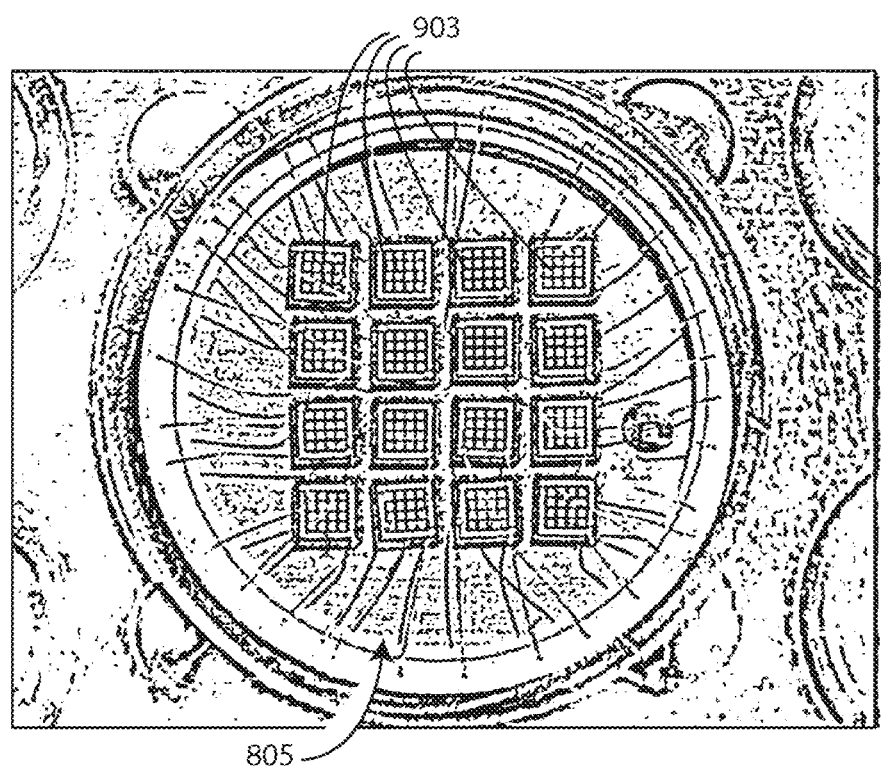
FIG. 9 shows a line drawing made from a photograph of an enlarged view of an array module such as shown in FIG. 8, and shows a 4×4 matrix of sets of LEDs and leads thereto.

FIG. 9 shows a line drawing made from a photograph of an enlarged view of an array module and shows the 4×4 matrix 805 of sets 903 of LEDs and leads thereto. Each set 903 can be seen to include a 4×4 array of LED units.

Figure 10:
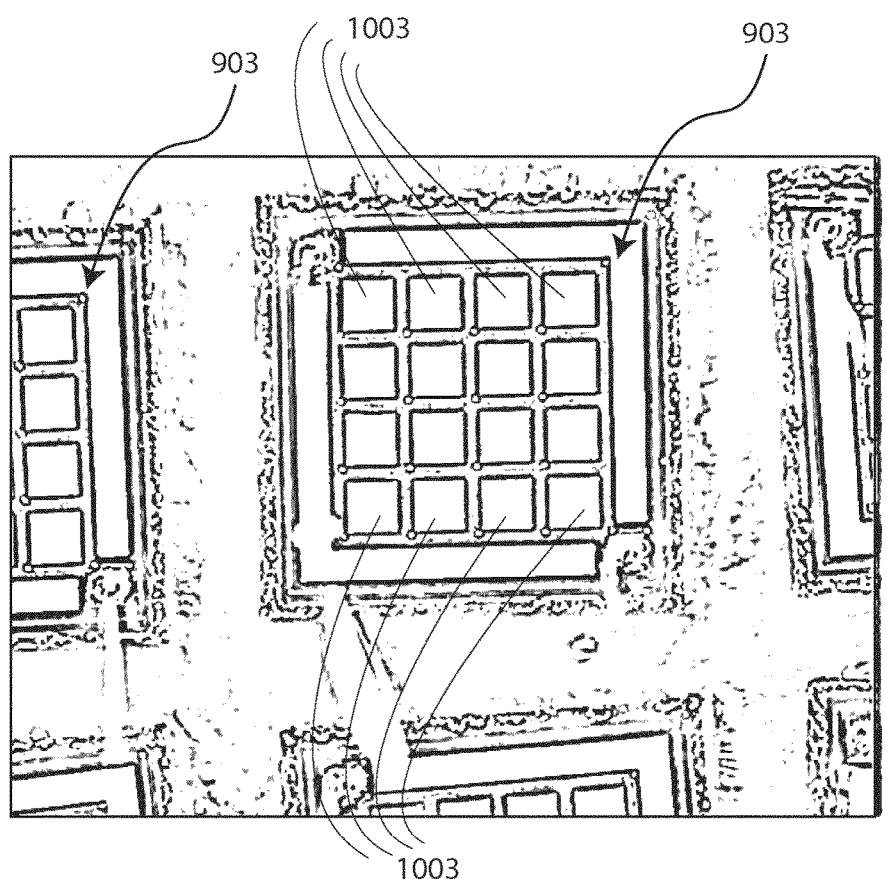
FIG. 10 shows a line drawing made from a photograph of an even more enlarged view of an array module such as shown in FIG. 8, showing individual sets of LEDs, including one complete set.

FIG. 10 shows a line drawing made from a photograph of an even more enlarged view of an array module, showing individual sets 903 of LEDs, including one complete set. The sets 903 of LEDs each include a 4×4 matrix of LED units 1003, each LED unit 1003 made up of 22×19 LEDs.

Figure 11:
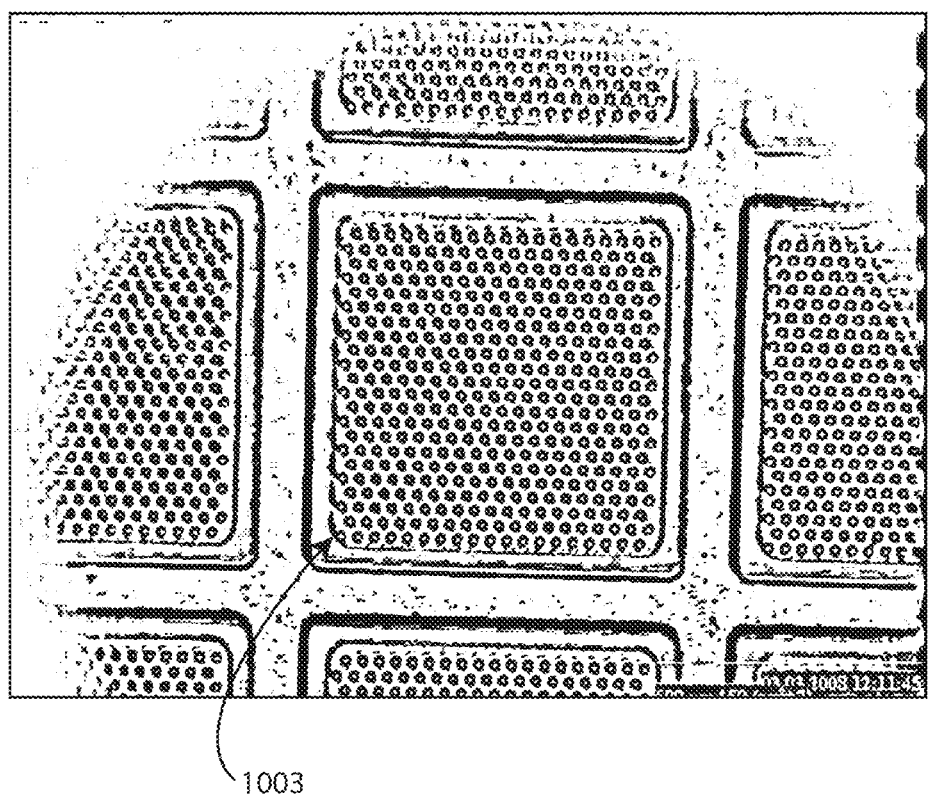
FIG. 11 shows a line drawing made from a photograph of a yet even more enlarged view of an array module such as shown in FIG. 8, showing individual units of LEDs, including one complete unit of 22×19 LEDs.

FIG. 11 shows a line drawing made from a photograph of a yet even more enlarged view of an array module, showing individual units 1003 of LEDs, including one complete unit 1003 of 22×19 LEDs.

Methods of Curing Using a Kaleidoscope Arrangement:

Embodiments of the invention include apparatuses and methods of curing the photo-curable material, e.g., UV curable material, e.g., photopolymer material on a plate that includes photo-curable material, e.g., that is made of the material or that has such material thereon.

One method embodiment comprises placing photo-curable plate near a light exposure unit having a length, a cross-section, and a pair of ends being a source end and a plate end. The plate is placed with the printing surface closer to the plate end than the source end with the plate substantially parallel to the cross-section of the light exposure unit.

The light exposure unit is as described above, and includes a light tunnel of light reflective, e.g., mirrored walls and having a polygonal cross-section like a kaleidoscope, wherein one example includes at least four walls, each wall having a reflective inner surface, e.g., the wall being mirrored or having a mirror attached on it. The light exposure unit also includes a light source, e.g., UV source located at or near one end, called the source end of the light tunnel and arranges in operation to produce light radiation, e.g., UV radiation to the inside of the light tunnel towards the other end of the light tunnel, called plate end, including towards the reflective inner surfaces of the walls.

The method includes causing the light source to operate to cure the plate material by applying light radiation, e.g., UV radiation for a time sufficient for curing.

In some embodiments, the light exposure unit is in a fixed position above a flat lying photopolymer printing plate positioned to cure the plate by exposure for a sufficient exposure time. Consider for example, the illumination arrangement of FIG. 5 or FIG. 6. Denote the power density, i.e., the intensity, e.g., in W/cm² by H. For a given UV power the intensity of the illumination H is:

$$H=P/(a*b);$$

where P denotes the power out of the aperture and * denotes multiplication.

The exposure, denoted E to the plate is then E=H*T, e.g., in J/cm² if P is in W/cm², where T denotes the exposure time in s. A sufficient exposure time is required for curing in order to ensure that the chain reactions that cause curing have sufficient time. Thus, the requirements for curing are energy, e.g., as an intensity in J/cm² applied over a particular curing time T.

The light tube length c affects the degree of comingling the angle of incidence. The inventors have noticed that the longer the light tube length, the more homogeneous is the angle distribution.

In terms of illumination, the inventor and others have noticed that for common polymer plates, e.g., Cyrel DPI from E. I. du Pont de Nemours and Company, Wilmington, Del. (DuPont), the time for the entire curing process is between 12 and 15 minutes while the illumination is specified with 19-20 mW/cm². The curing then is about 19 J/cm² usually applied within 16 minutes at 19-20 mW/cm².

In other embodiments, the method of curing includes causing relative motion between the light exposure unit and the plate during operation of the light source in order to cure the photo-curable material on the plate. The relative motion is selected according to the area of the aperture of the light tube, the energy density at the aperture, and the required curing time to achieve, over the motion, the needed exposure time and the needed curing energy density.

Apparatus embodiments that carry out the method include a drive mechanism to produce relative motion between the light exposure unit and the plate during curing of the plate. A control system is included to control the motion and the application of light energy.

Figure 12:
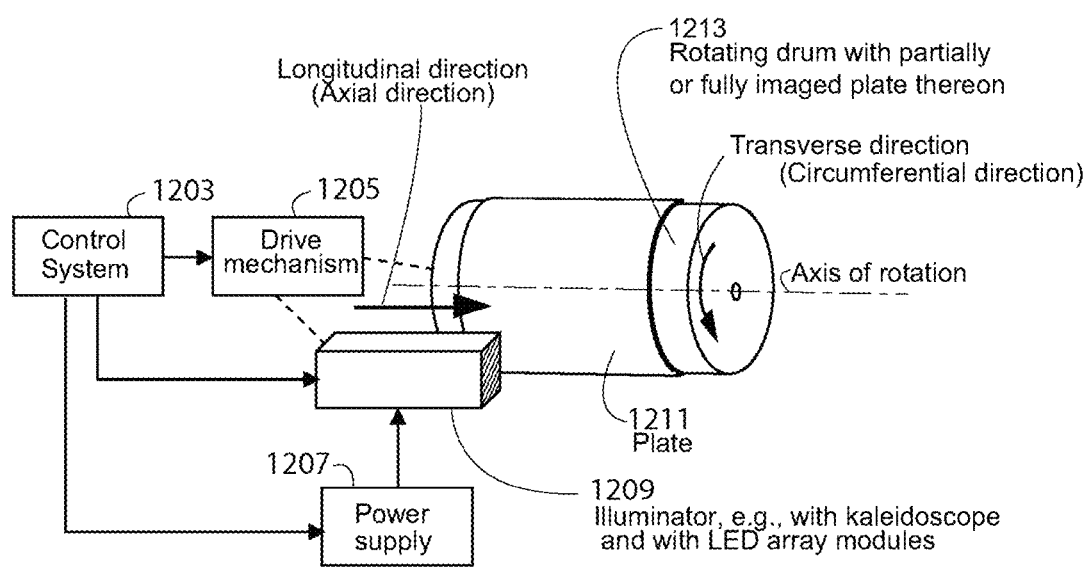
FIG. 12 shows in simplified form one example embodiment of a drum exposing arrangement for using a light source and light tube for curing a plate.

FIG. 12 shows in simplified form one example of such an arrangement. The apparatus includes a control system 1203 coupled to the drive mechanism 1205 and to a power supply 1207 to supply power to an illuminator 1209 that in one embodiment is an LED light source as described above, e.g., having 15 or so LED array modules arranged in two rows, with a light aperture in the light tube of rectangular dimension. The drive mechanism 1205 is configured to move the light exposure unit (illuminator) 1209 along the direction of the axis of rotation of a rotatable drum 1213 on which a photo-curable plate 1211 is placed, while the drum 1213 rotates. This direction is called the longitudinal direction, also in this case, the axial direction. The speed of axial motion and the speed of rotation are configured according to the intensity of light output of the exposure unit 1209 to provide appropriate exposure to light to cure the plate in the required amount of time.

The direction of the circumference is called the circumferential direction in this case, and in the transverse direction in general, and is the direction substantially perpendicular to the longitudinal direction.

One embodiment of the illuminator uses up to 20 arrays for an 8×42 cm aperture, capable of 200 W of output, the larger dimension parallel to the longitudinal direction.

In one embodiment, the UV is distributed over the aperture width 42 cm times the drum circumference which in one embodiment is 89 cm, which results in about 53 mW/cm² intensity.

One advantage of the embodiment shown is that with it, inline curing is possible. That is, the imaging and curing may be combined in the one apparatus. In one embodiment, a laser imaging unit including imaging elements is included and configured to transfer imaging data to the part of the plate precedes the illuminating part. In such a case, the plate is at some stage partially imaged.

In another embodiment, the imaging occurs separately prior to the plate being loaded for exposure to UV for curing. In such a case, the plate 1211 is fully imaged.

Figure 13:
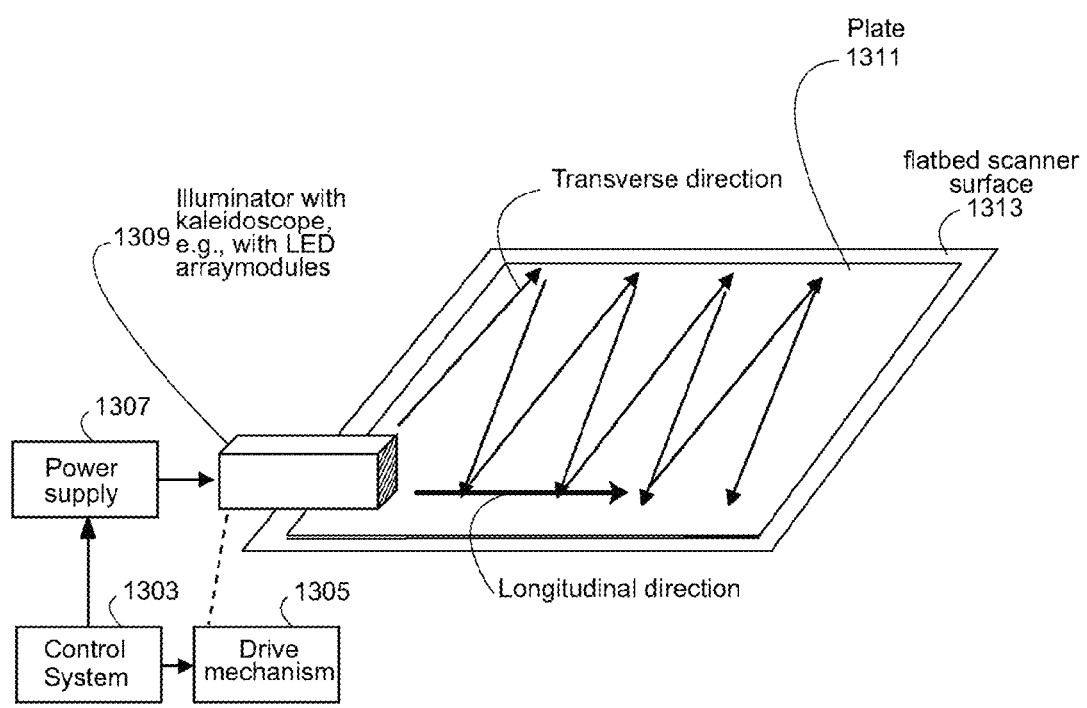
FIG. 13 shows in simplified form one example embodiment of a flatbed exposing arrangement for using a light source and light tube for curing a plate.

FIG. 13 shows another method of an apparatus for curing a plate 1311 on a flatbed scanner surface 1313 of a flatbed output scanner also called an x-y table. The apparatus includes a control system 1303 coupled to the drive mechanism 1305 and to a power supply 1307 configured to supply power to an illuminator 1309 that includes the "kaleidoscope" structure described herein, and in one embodiment is an LED light source as described above, e.g., having 15 or 20 LED array modules arranged in two rows, with a light aperture in the light tube of rectangular dimension. The control system 1303 and drive mechanism 1305 cooperate to cause back/forth relative motion in a transverse direction between a light source and a plate further to cause relative motion between the light source and the plate in a longitudinal direction. In the embodiment shown, the longitudinal relative motion is caused by the drive mechanism moving the light source.

As in the case of the rotating drum configuration, in one embodiment, a laser imaging unit including imaging elements is included and configured to transfer imaging data to the part of the plate precedes the illuminating part. In such a case, the plate is at some stage partially imaged. In another embodiment, the imaging occurs separately prior to the plate being loaded for exposure to UV for curing. In such a case, the plate 1311 is fully imaged.

Figure 14:
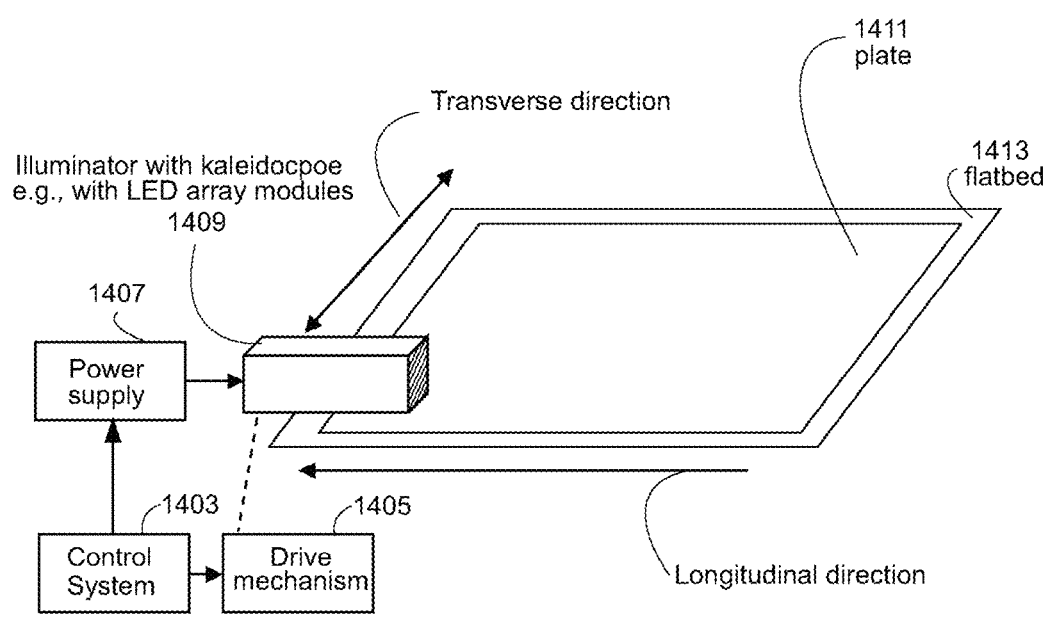
FIG. 14 shows in simplified form another example embodiment of a flatbed exposing arrangement for using a light source and light tube for curing a plate.

FIG. 14 shows yet another method of an apparatus for curing a plate 1411 on a flatbed surface 1413, e.g., on a flatbed output scanner that has a different configuration to the flatbed output scanner of FIG. 13. The apparatus includes a control system 1403 coupled to a drive mechanism 1405 and to a power supply 1407 configured to supply power to an illuminator 1409 that in one embodiment is an LED light source as described above, e.g., having 15 or 20 LED array modules arranged in two rows, with a light aperture in the light tube of rectangular dimension. The control system 1403 and drive mechanism 1405 cooperate to cause back/forth relative motion in a transverse direction between the light from the illuminator 1409 and the plate 1411 and further to cause relative motion between the light from the illuminator 1409 and the plate 1411 in a longitudinal direction. In this case, the longitudinal relative motion is caused by the drive mechanism 1405 moving the flatbed surface 1413 containing the plate 1411 to move.

As in the case of the rotating drum configuration, in one embodiment, a laser imaging unit including imaging elements is included and configured to transfer imaging data to the part of the plate precedes the illuminating part. In such a case, the plate is at some stage partially imaged. In another embodiment, the imaging occurs separately prior to the plate being loaded for exposure to UV for curing. In such a case, the plate 1411 is fully imaged.

Figure 15:
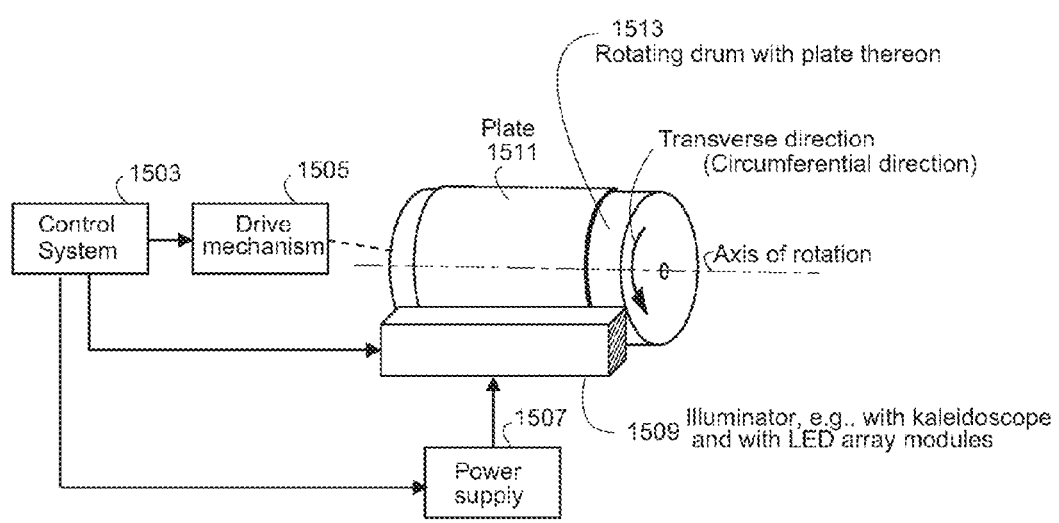
FIG. 15 shows an embodiment of a rotating drum arrangement in which the illumination unit extends to cover one dimension of the plate.

FIG. 15 shows a simple drawing of yet another embodiment of a rotating drum arrangement in which an illumination unit 1509 extends to cover one dimension of the plate, e.g., plate 1511 that is on a rotatable drum 1513. In the example shown, this one dimension is the longitudinal direction. A control system 1503, a drive system 1505 and a power supply 1507 are included. Relative motion in only one direction is then necessary, in this example, the circumferential, i.e., transverse direction. Some versions of the apparatus include a laser imaging unit that is configured to image the plate prior to the illumination unit 1509 exposing the imaged plate for curing the plate.

Figure 16:
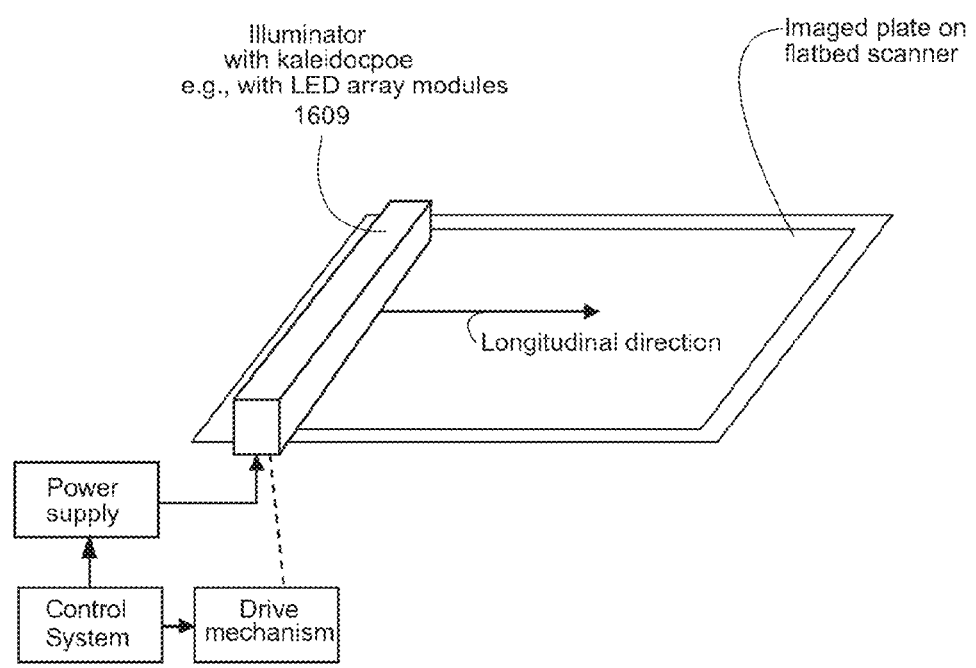
FIG. 16 shows an embodiment of a flatbed arrangement, in which the illumination unit extends to cover one dimension of the plate

FIG. 16 shows another simple drawing of yet another embodiment, this one a flatbed arrangement, in which an illumination unit 1609 extends to cover one dimension of the plate. In the example shown, this is the transverse direction. Relative motion in only one direction is again used, in this example, the longitudinal direction. In this example, the exposure unit 1609 moves in the longitudinal direction over the plate. Some versions of the apparatus include a laser imaging unit that is configured to image the plate prior to the illumination unit 1609 exposing the imaged plate for curing the plate.

Figure 17:
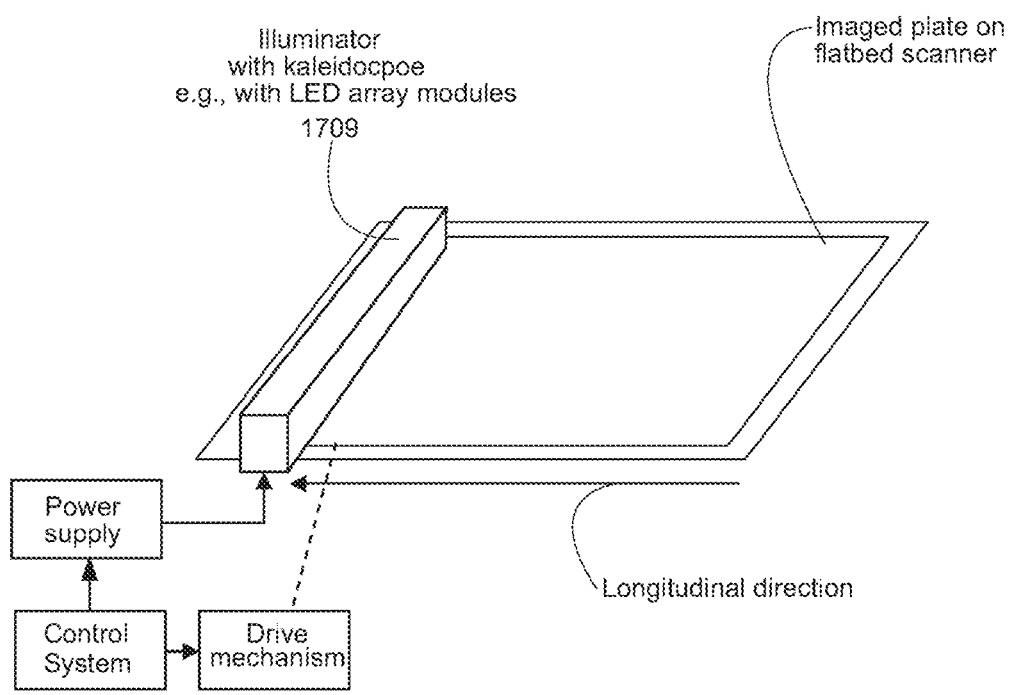
FIG. 17 shows another embodiment of a flatbed arrangement in which the illumination unit extends to cover one dimension of the plate, in this case with the relative motion provide by the plate moving in the longitudinal direction.

FIG. 17 shows another embodiment of a flatbed arrangement in which an illumination unit 1709 extends to cover one dimension of the plate, in this case with the relative motion provide by the plate moving in the longitudinal direction. In some versions of the apparatus, a laser imaging unit including imaging elements is included and configured to transfer imaging data to the part precedes the illuminating part. Some versions of the apparatus include a laser imaging unit that is configured to image the plate prior to the illumination unit 1709 exposing the imaged plate for curing the plate.

Figure 18:
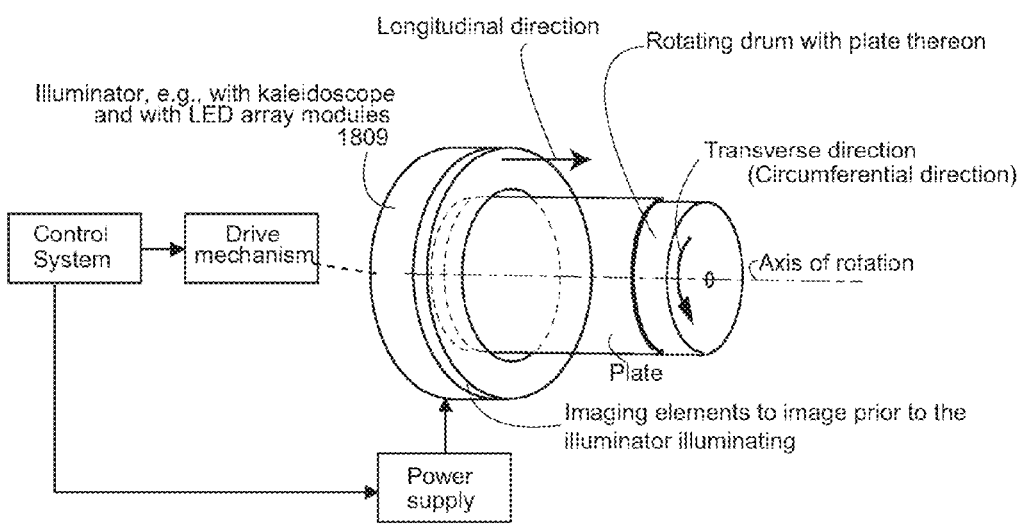
FIG. 18 shows another embodiment of a rotating drum arrangement in which the illumination unit extends to cover one dimension of the plate, in this case the circumferential direction.

FIG. 18 shows a simple drawing of yet another embodiment of a rotating drum arrangement in which the illumination unit extends to cover one dimension of the plate, in this case the circumferential direction. In the example shown, the illumination unit 1809 wraps around the drum, e.g., is in the form of a toroid around the drum. Relative motion is provided in the longitudinal direction. No rotation of drum is necessary for curing, but of course might still occur, e.g., as the drum is slowing down, in another embodiment, inline with the imaging. That is, a laser imaging unit including imaging elements is included and configured to transfer imaging data to the part precedes the illuminating part. Note that details of the imaging are not shown in order not to obscure the curing operation of the apparatus.

In FIGS. 12 to 18, elements such as 1209, 1309, 1409, 1509, 1609, 1709, and 1809, while having different reference numbers, may be similar or identical in structure. Similarly the plate and other shown elements may be similar or identical even if different reference numerals are used.

Note that some of the arrangements above may include an imaging unit to enable inline imaging and curing. Other arrangements do not include the imaging unit. The invention is not limited to combining of the imaging and curing in one exposure apparatus, and in some arrangements, the imaging and curing can be carried out separately each in its own apparatus. Therefore, in some arrangements, there is a separate imaging apparatus, e.g., a rotating drum imaging apparatus as is known in the art, or a flatbed imaging apparatus as is known in the art, and also a separate curing apparatus, e.g., a flatbed arrangement that include one or more features of the present invention or a rotating drum arrangement that include one or more features of the present invention.

Other variations also are possible.

The Plates

By the terms "polymer plate" and "photopolymer plate" herein is meant a plate with any type of photo-curable material thereon. One example is UV-curable material. Another example is material cured by light of different wavelength, not necessarily UV. Today, such curing is typically with UV, and such materials are photopolymers. However, the term "photopolymer" is not meant to be limiting to a polymer composition. The inventor anticipates that in the future, there may be new materials and compositions that also are curable UV radiation of a desired wavelength, and the invention is equally applicable to plates having such material thereon.

The method and apparatuses described herein are used for curing many types of plates. The plates can be flexographic plates, flexographic imaging cylinders, flexographic sleeves, and so forth. The plate also can be letterpress plates having UV curable material thereon. Furthermore, the plates can be imaged using a conventional analog process, e.g., film, so that the curing is with the developed film over the plate material. Furthermore, the plates can be imaged using a digital process, e.g., by laser ablating an abatable surface on the plate material prior to final curing, so that curing is with the mask on the plate material after ablation of some of the mask material according to imaging data.

Therefore, in some embodiments, the plate is a photopolymer printing plate that is a digital plate.

In some embodiments, a photopolymer printing plate that is a conventional analog plate.

In some embodiments, the plate is a photopolymer printing plate that is a sleeve.

In some embodiments, the plate is a photopolymer printing plate that is a polymer coated cylinder.

Furthermore, some embodiments of the invention are in the form of a plate—any of the plates described above—that has been cured, the curing according to a method as described herein.

Furthermore, some embodiments of the invention are in the form of a plate—any of the plates described above—that has been imaged then cured, the curing according to a method as described herein.

General

Unless specifically stated otherwise, as apparent from the following discussions, it is appreciated that throughout the specification discussions utilizing terms such as "processing," "computing," "calculating," "determining" or the like, refer to the action and/or processes of a computer or computing system, or similar electronic computing device, that manipulate and/or transform data represented as physical, such as electronic, quantities into other data similarly represented as physical quantities.

In a similar manner, the term "processor" may refer to any device or portion of a device that processes electronic data, e.g., from registers and/or memory to transform that electronic data into other electronic data that, e.g., may be stored in registers and/or memory. A "computer" or a "computing machine" or a "computing platform" may include one or more processors.

Note that when a method is described that includes several elements, e.g., several steps, no ordering of such elements, e.g., of steps is implied, unless specifically stated.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the above description of example embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the DESCRIPTION OF EXAMPLE EMBODIMENTS are hereby expressly incorporated into this DESCRIPTION OF EXAMPLE EMBODIMENTS, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

As used herein, unless otherwise specified the use of the ordinal adjectives "first", "second", "third", etc., to describe a common object, merely indicate that different instances of like objects are being referred to, and are not intended to imply that the objects so described must be in a given sequence, either temporally, spatially, in ranking, or in any other manner.

All U.S. patent publications, U.S. patents, and U.S. patent applications cited herein are hereby incorporated by reference. In the case the Patent Rules or Statutes do not permit incorporation by reference of material that itself incorporates information by reference, the incorporation by reference of the material herein excludes any information incorporated by reference in such incorporated by reference material, unless such information is explicitly incorporated herein by reference.

Any discussion of prior art in this specification should in no way be considered an admission that such prior art is widely known, is publicly known, or forms part of the general knowledge in the field.

In the claims below and the description herein, any one of the terms comprising, comprised of or which comprises is an open term that means including at least the elements/features that follow, but not excluding others. Thus, the term comprising, when used in the claims, should not be interpreted as being limitative to the means or elements or steps listed thereafter. For example, the scope of the expression a device comprising A and B should not be limited to devices consisting only of elements A and B. Any one of the terms including or which includes or that includes as used herein is also an open term that also means including at least the elements/ features that follow the term, but not excluding others. Thus, including is synonymous with and means comprising.

Similarly, it is to be noticed that the term coupled, when used in the claims, should not be interpreted as being limitative to direct connections only. The terms "coupled" and "connected," along with their derivatives, may be used. It should be understood that these terms are not intended as synonyms for each other. Thus, the scope of the expression a device A coupled to a device B should not be limited to devices or systems wherein an output of device A is directly connected to an input of device B. It means that there exists a path between an output of A and an input of B which may be a path including other devices or means. "Coupled" may mean that two or more elements are either in direct physical or electrical contact, or that two or more elements are not in direct contact with each other but yet still co-operate or interact with each other.

Thus, while there has been described what are believed to be the preferred embodiments of the invention, those skilled in the art will recognize that other and further modifications may be made thereto without departing from the spirit of the invention, and it is intended to claim all such changes and modifications as fall within the scope of the invention. For example, any formulas given above are merely representative of procedures that may be used. Functionality may be added or deleted from the block diagrams and operations may be interchanged among functional blocks. Steps may be added or deleted to methods described within the scope of the present invention.

I claim:

1. An apparatus comprising:

a flatbed or drum surface configured to have a photo-curable printing plate placed thereon with a mask covering a surface of the plate in order to cure the plate by exposing the plate to UV radiation;

a light tunnel of at least four light reflective walls having a uniform polygonal cross-section and a length; and a UV light source comprising an LED or an array of LEDs located at or near one end, called the source end of the light tunnel and arranged in operation to produce UV light radiation to the inside of the light tunnel towards the other end of the light tunnel, called the plate end, including towards the reflective inner surfaces of the walls, such that UV light entering the light tunnel towards an inner reflective surface of a wall is reflected off the inner reflective surface so that the UV light can emerge from the plate end with divergence, wherein the UV light source has a power sufficiently high to emerge from the plate end with an intensity of at least 19 mW/cm$^2$;

wherein the combination of the light tunnel and the UV light source forms a light exposure unit producing UV light emerging from the plate end at the intensity of at least 19 mW/cm$^2$, wherein the exposure unit is located with the plate end over and near at least part of the surface of the flatbed or drum, and wherein after the photo-curable printing plate and the mask covering the surface of the plate are placed on the surface of the flatbed or drum, the exposure unit is operative to cure the plate by exposure through the mask to UV light radiation exiting the plate end at a sufficiently high exposure, with sufficient divergence as a result of the light tunnel being sufficiently long, and for a time sufficient to cure the plate that is exposed to the UV light radiation to obtain broader support shoulders for halftone dots on the cured plate than if the UV light source was used without the light tunnel.

2. An apparatus, as recited in claim 1, wherein each wall of the light tunnel is planar and has a reflective inner surface that is substantially flat, including side walls that include pairs of walls arranged so that each wall in each pair is substantially parallel to an opposite wall of the pair, with the reflective surfaces facing each other.

3. An apparatus, as recited in claim 1, wherein cross section of the light tunnel is rectangular.

4. An apparatus as recited in claim 1, wherein the light exposure unit is in a fixed position above a flat lying photopolymer printing plate positioned to cure the plate by exposure for a sufficient exposure time.

5. An apparatus as recited in claim 1, further comprising a drive mechanism to produce relative motion between the light exposure unit and the plate during curing of the plate.

6. An apparatus as recited in claim 5, wherein the drive mechanism is coupled to a rotatable drum that has said drum surface, and wherein the drive mechanism is configured to move the light exposure unit along the direction of the axis of rotation of the rotatable drum on whose drum surface a photo-curable plate is placed, while the drum is rotated, wherein the speed of axial motion and the speed of rotation are configured according to the intensity of UV light output of the exposure unit to provide appropriate exposure to UV light to cure the plate.

7. An apparatus as recited in claim 5, wherein the light exposure unit extends to cover one dimension of the plate and wherein the relative motion includes relative motion in the direction perpendicular to the one dimension of the plate.

8. An apparatus as recited in claim 7, wherein the drive mechanism is configured to rotate a rotatable drum that has said drum surface, wherein the photo-curable plate is placed on the drum surface, and wherein the light exposure unit extends to cover the length of the drum.

9. An apparatus as recited in claim 5, further comprising a laser imaging unit arranged to expose the photopolymer plate with imaging data before the photopolymer material is cured, such that imaging the printing plate according to the imaging data and curing occur inline in the same apparatus.

10. An apparatus as recited in claim 1, wherein the reflective surfaces include metal coated glass plates such as conventional glass mirrors.

11. An apparatus as recited in claim 1, wherein the walls are made of UV reflective material coated aluminum sheets, with the inner surfaces coated.

12. An apparatus as recited in claim 11, wherein the respective reflective surface of at least some of the walls is embossed with UV light diffusing structures.

13. An apparatus as recited in claim 1, wherein the photo-curable plate is a photopolymer printing plate that is a conventional analog plate.

14. An apparatus as recited in claim 1, wherein the photo-curable plate is a photopolymer printing plate that is a digital plate.

15. An apparatus as recited in claim 1, wherein the photo-curable plate is a photopolymer printing plate that is a sleeve.

16. An apparatus as recited in claim 1, wherein the photo-curable plate is a photopolymer printing plate that is a polymer coated cylinder.

17. An apparatus as recited in claim 1, wherein the photo-curable plate is a photopolymer printing plate that is a letter-press plate.

18. A method comprising:
placing a photo-curable printing plate on a flatbed or drum surface configured to have the plate placed thereon with a mask covering a surface of the plate in order to cure the plate by exposing the plate to UV radiation, such that the plate is placed near a light exposure unit having a length, a uniform cross-section, and a pair of ends being a source end and a plate end, the plate having a printing surface placed with the printing surface closer to the plate end than the source end with the plate substantially parallel to the cross-section of the light exposure unit operative to produce UV light at an intensity of at least 19 mW/cm$^2$, wherein the light exposure unit includes:
a light tunnel of at least four light reflective walls and having a uniform polygonal cross-section; and
a UV light source comprising an LED or an array of LEDs located at or near the source end of the light tunnel and arranged in operation to produce UV light radiation to the inside of the light tunnel towards the plate end, including towards the reflective inner surfaces of the walls; such that UV light from the UV light source entering the light tunnel towards an inner reflective surface of a wall is reflected off the inner reflective surface so that the UV light can emerge from the plate end with divergence, wherein the UV light source has a power sufficiently high to emerge from the plate end with the intensity of at least 19 mW/cm$^2$; and
causing the UV light source to operate to cure the plate material by applying UV light radiation exiting the plate end with sufficient divergence as a result of the light tunnel being sufficiently long, at a sufficiently high exposure, and for a time sufficient for curing the plate to obtain broader support shoulders for halftone dots on the cured plate than if the UV light source was used without the light tunnel.

19. A method as recited in claim 18, wherein each wall of the light tunnel is planar and has a reflective inner surface that is substantially flat, wherein pairs of the walls are arranged so that each wall in each pair is substantially parallel to an opposite wall of the pair, with the reflective surfaces facing each other.

20. A method as recited in claim 18, further comprising causing relative motion between the light exposure unit and the plate during operation of the light source in order to cure the photo-curable material on the plate.

21. A method as recited in claim 20, wherein causing the relative motion includes:
rotating a rotatable drum that has the drum surface and on whose drum surface the photo-curable plate is placed; and
moving the light exposure unit along the direction of the axis of rotation of the rotating rotatable drum on whose drum surface a photo-curable plate is placed while the drum rotates,
wherein the speed of axial motion and the speed of rotation are configured according to the intensity of UV light output of the exposure unit to provide appropriate exposure to UV light to cure the plate.

22. A method as recited in claim 20, wherein the causing relative motion between the light exposure unit and the plate further causes relative motion between a laser imaging unit and the plate, the laser imaging unit being configured to transfer imaging data to the plate before the photopolymer material is cured, such that the method further includes imaging the printing plate according to the imaging data and such that the imaging and causing the light source to cure occur inline in the same apparatus.

23. A method as recited in claim 18, wherein the reflective surfaces include metal coated glass plates that form conventional glass minors.

24. A method as recited in claim 18, wherein the walls are made of UV reflective material coated aluminum sheets, with the inner surfaces coated.

25. A method as recited in claim 24, wherein the respective reflective surface of at least some of the walls is embossed with UV light diffusing structures.

26. A method as recited in claim 18, wherein the photocurable plate is a photopolymer printing plate that is a conventional analog plate.

27. A method as recited in claim 18, wherein the photocurable plate is a photopolymer printing plate that is a digital plate.

28. A method as recited in claim 18, wherein the photocurable plate is a photopolymer printing plate that is a sleeve.

29. A method as recited in claim 18, wherein the photocurable plate is a photopolymer printing plate that is a polymer coated cylinder.

30. A method as recited in claim 18, wherein the photocurable plate is a photopolymer printing plate that is a letterpress plate.

\* \* \* \* \*